United States Patent
Kobayashi

(10) Patent No.: US 9,559,334 B2
(45) Date of Patent: Jan. 31, 2017

(54) ORGANIC LIGHT EMITTING DEVICE AND METHOD OF MANUFACTURING THE SAME

(71) Applicant: Ye Xin Technology Consulting Co., Ltd., Hsinchu (TW)

(72) Inventor: Setsuo Kobayashi, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/692,252

(22) Filed: Apr. 21, 2015

(65) Prior Publication Data

US 2016/0285041 A1    Sep. 29, 2016

(30) Foreign Application Priority Data

Mar. 25, 2015    (CN) .......................... 2015 1 0132553

(51) Int. Cl.
*H01L 51/52* (2006.01)
*H01L 51/50* (2006.01)
*H01L 51/56* (2006.01)

(52) U.S. Cl.
CPC ....... *H01L 51/5253* (2013.01); *H01L 51/5012* (2013.01); *H01L 51/5218* (2013.01); *H01L 51/56* (2013.01)

(58) Field of Classification Search
CPC combination set(s) only.
See application file for complete search history.

(56) References Cited

U.S. PATENT DOCUMENTS

| 2010/0258789 | A1* | 10/2010 | Akai | C09K 11/025 257/40 |
| 2012/0164772 | A1* | 6/2012 | Lee | C23C 14/042 438/34 |
| 2013/0236822 | A1* | 9/2013 | Ono | G03G 15/75 430/56 |
| 2013/0335375 | A1* | 12/2013 | Nishikawa | G06F 3/044 345/174 |

FOREIGN PATENT DOCUMENTS

JP    2012-54244 A    3/2012

* cited by examiner

*Primary Examiner* — Mohammad Islam
*Assistant Examiner* — Ratisha Mehta
(74) *Attorney, Agent, or Firm* — Zhigang Ma

(57) ABSTRACT

An organic light emitting device includes a substrate and an organic compound layer sandwiched between a pair of electrodes composed of an anode and a cathode. The organic compound layer includes at least two active layers. A melting point of each of the two active layers gradually decreases along a direction from the anode to the cathode.

12 Claims, 8 Drawing Sheets

ORGANIC LIGHT EMITTING DEVICE AND METHOD OF MANUFACTURING THE SAME

CROSS-REFERENCE TO RELATED APPLICATIONS

This application claims priority to Chinese Patent Application No. 201510132553.7 filed on Mar. 25, 2015 in the Chinese Intellectual Property Office, the contents of which are incorporated by reference herein.

FIELD

The subject matter herein generally relates to an organic light emitting device including an organic compound layer having at least two active layers which are sandwiched between a pair of electrodes composed of an anode and a cathode.

BACKGROUND

An organic light emitting device generally includes an emissive electroluminescent layer which is a film of organic compound layer that emits light in response to an electric current. The organic compound layer is situated between a pair of electrodes which respectively are an anode and a cathode. In particular, the organic light emitting device can significantly reduce applied voltage, can be easily downsized, requires small power consumption, enables surface emission, and facilitates light emission of three primary colors. Therefore, research for putting the organic light-emitting devices into practical use as new-generation light-emitting devices has been vigorously conducted. In a typical organic light emitting device, the organic compound layer can be manufactured by injecting liquid materials such as using an inkjet device to form an organic film on a substrate. However, the organic film may suffer from thickness mura due to the surface tension of the liquid materials.

BRIEF DESCRIPTION OF THE DRAWINGS

Implementations of the present technology will now be described, by way of example only, with reference to the attached figures.

DETAILED DESCRIPTION

Figure 1:
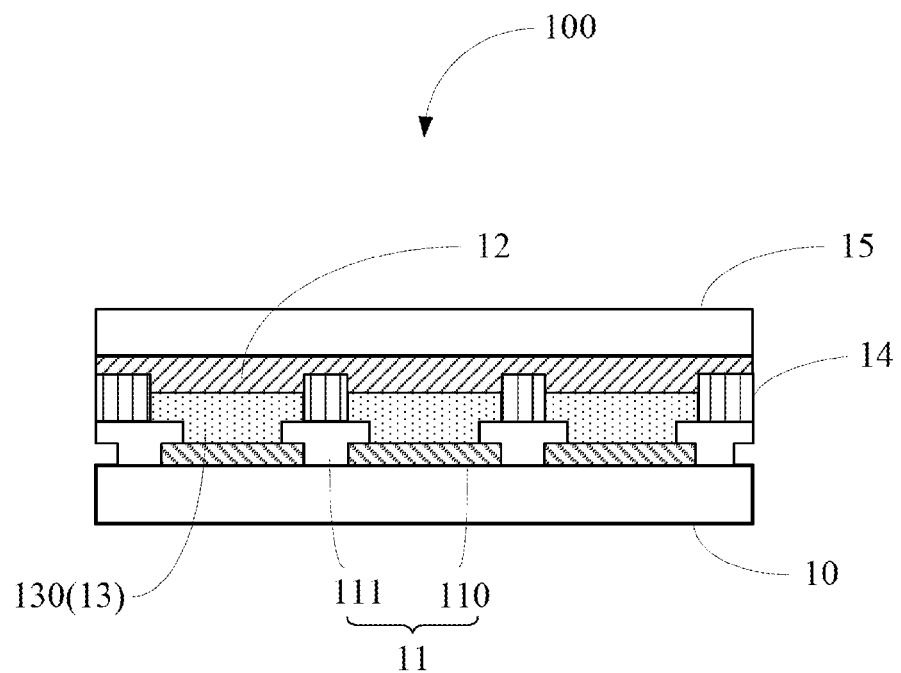
FIG. 1 is a cross-sectional view of an organic light emitting device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The present disclosure is described in relation to an organic light emitting device.

FIG. 1 is a cross-sectional view of an organic light emitting device 100. In at least one embodiment, the organic light emitting device 100 can be utilized in a liquid crystal device (LCD) to serve as a backlight. The organic light emitting device 100 includes a substrate 10, a pair of electrodes composed of an anode 11 and a cathode 12, and an organic compound layer 13 sandwiched between the anode 11 and the cathode 12.

In at least one embodiment, the substrate 10 is a transparent substrate. For example, the transparent substrate can be a glass substrate, a plastic substrate, or a flexible substrate. The plastic substrate or the flexible substrate can be made of polycarbonate (PC), polyester (PET), cyclic olefin copolymer (COC), metallocene-based cyclic olefincopolymer, (mCOC), or other like materials. The glass substrate can be a thin glass substrate.

The anode can be a transparent electrode which is made of transparent conductive materials, such as indium tin oxide (ITO), indium zinc oxide (IZO), aluminum zinc oxide (AZO), transparent conductive film, or other like transparent conductive materials. The anode 11 can include a plurality of electrode units 110 and a plurality of insulators 111. In this embodiment, each insulator 111 is located between two adjacent electrode units 110 to separate the two adjacent electrode units 110 from each other.

The cathode 12 can be made of metal materials, such as aluminum (Al), calcium (Ca), magnesium (Mg), indium (In), manganese (Mn), silver (Ag), or metal compounds thereof.

The organic compound layer 13 includes a plurality of light emitting units 130. Each light emitting unit 130 is located on a surface of a corresponding electrode unit 110 adjacent to the cathode 12. In addition, in this embodiment, the organic light emitting device 100 further includes a plurality of spacers 14 respectively located on the surfaces of the insulators 111. Each spacer 14 is located between two adjacent light emitting units 130 to separate the two adjacent light emitting units 130. In at least one embodiment, the light emitting units 130 can include at least one red light emitting unit (R), at least one green light emitting unit (G), and at least one blue light emitting unit (B). Thus, the organic light emitting device 100 utilized in an LCD can realize a full color display function.

Figure 2:
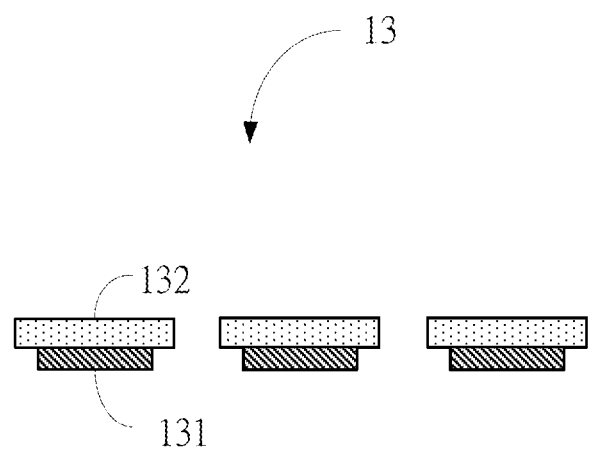
FIG. 2 shows a diagrammatic view of an organic compound layer of the organic light emitting device of FIG. 1 including two active layers according to a first embodiment.

The organic compound layer 13 has current-illumination characteristics which can emit light under the interaction of both the anode 11 and the cathode 12. The organic compound layer 13 includes at least two active layers which are stacked together in sequence. FIG. 2 shows a first embodiment of the organic compound layer 13 which includes a hole transporting layer (HTL) 131 and an organic luminescent layer 132. The hole transporting layer 131 is first formed on a surface of the anode 11 adjacent to the cathode 12. The organic luminescent layer 132 is then formed on a surface of the hole transporting layer 131 after the hole transporting layer 131 is formed on the surface of the anode 11. In this embodiment, the hole transporting layer 131 and the organic luminescent layer 132 are respectively made of different organic materials having different melting points. In this embodiment, a melting point of the hole transporting layer 131 adjacent to the anode 11 is greater than a melting point of the organic luminescent layer 132 away from the anode 11. That is, the melting points of the respective two active layers (such as the hole transporting layer 131 and the organic luminescent layer 132) gradually decrease along a direction from the anode 11 to the cathode 12. In the embodiment, the hole transporting layer 131 and the organic luminescent layer 132 of the organic compound layer 13 are made of fatty acids compounds, such as resin materials, which have a melting point from about 90 degrees to 130 degrees.

Figure 3:
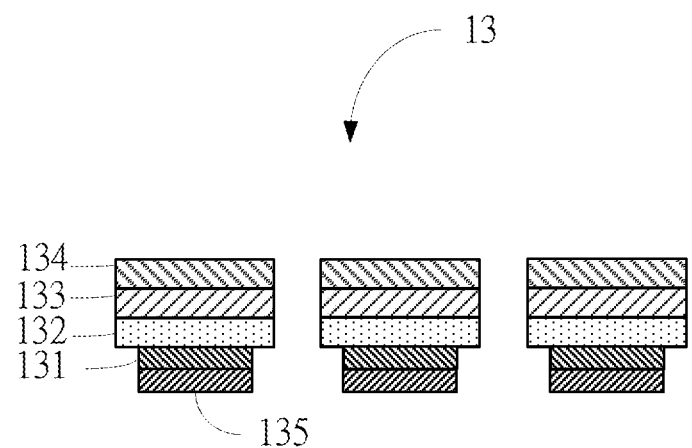
FIG. 3 shows a diagrammatic view of an organic compound layer of the organic light emitting device of FIG. 1 including more than two active layers according to a second embodiment.

In other embodiments, the organic compound layer 13 can include other active layers besides the hole transporting layer 131 and the organic luminescent layer 132 of FIG. 2. For example, FIG. 3 shows the organic compound layer 13 including more than two active layers according to a second embodiment. In the second embodiment, besides the hole transporting layer 131 and the organic luminescent layer 132, the organic compound layer 13 further includes an electron injecting layer 133, an electron transporting layer 134, and a hole injecting layer 135. In this embodiment, the hole injecting layer 135 is sandwiched between the anode 11 and the hole transporting layer 131. The electron injecting layer 133 is sandwiched between the organic luminescent layer 132 and the electron transporting layer 134. The electron transporting layer 134 is sandwiched between the electron injecting layer 133 and the cathode 12. That is, the hole injecting layer 135, the hole transporting layer 131, the organic luminescent layer 132, the electron injecting layer 133, and the electron layer 134 are stacked on a surface of the anode 11 adjacent to the cathode 12 in sequence. The hole injecting layer 135, the hole transporting layer 131, the organic luminescent layer 132, the electron injecting layer 133, and the electron layer 134 are respectively made of different organic materials having different melting points. Further, the melting point of each of the five active layers including the hole injecting layer 135, the hole transporting layer 131, the organic luminescent layer 132, the electron injecting layer 133, and the electron layer 134 gradually decreases along a direction from the anode 11 to the cathode 12. For example, the melting point of the hole injecting layer 135 is about from 125 degrees to 130 degrees. The melting point of the hole transporting layer 131 is from about 115 degrees to 125 degrees. The melting point of the organic luminescent layer 132 is from about 110 degrees to 115 degrees. The melting point of the electron injecting layer 133 is from about 100 degrees to 105 degrees. The melting point of the electron transporting layer 134 is from about 90 degrees to 95 degrees.

The organic light emitting device 100 further includes a protection layer 15 located on a surface of the cathode 12 away from the anode 11, to protect or encapsulate the organic light emitting device 100.

In operation, when a voltage is applied to the anode 11 and the cathode 12, electron holes from the anode 11 are injected into the organic luminescent layer 132 through the hole injecting layer 135 and the hole transporting layer 131, and electrons from the cathode 12 are injected into the organic luminescent layer 132 through the electron transporting layer 134 and the electron injecting layer 133. When the electron holes and the electrons encounter in the organic luminescent layer 132, organic luminescent materials in the organic luminescent layer 132 are activated to emit light.

FIGS. 4 to 7 illustrate a manufacturing process of the organic light emitting device 100 of FIG. 1.

Figure 4:
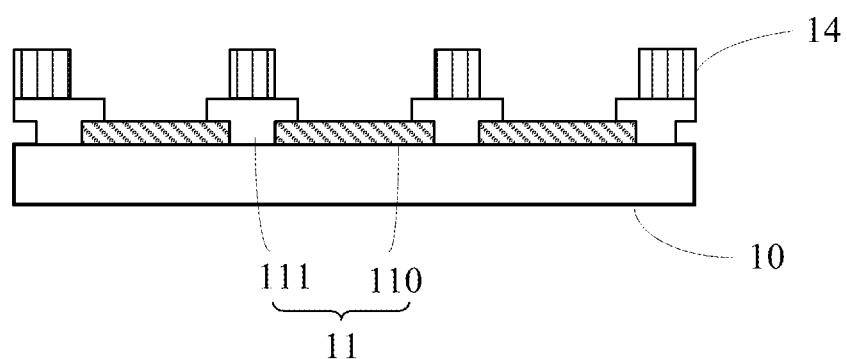
FIG. 4 shows an anode is formed on a substrate in a manufacturing process of the organic light emitting device of FIG. 1.

First, as shown in FIG. 4, an anode 11 is formed on a substrate 10. The anode 11 includes a plurality of electrode units 110 and a plurality of insulators 111. Each insulator 111 is located between two adjacent electrode units 110 to isolately separate the two adjacent electrode units 110 from each other. Further, a plurality of spacers 14 are respectively formed on the insulators 111.

Then, at least two organic materials having different melting points are respectively hot melted and formed on a surface of the anode 11 in sequence, to form an organic compound layer 13 having at least two active layers. In this embodiment, the at least two organic materials are solid at room temperature, and can be changed to liquid after being heated to their respective melting points. In the embodiment, each of the at least two organic materials are fatty acids compounds, such as resin materials, which have a melting point from about 90 degrees to 130 degrees. In the embodiment, the melting point of one of the at least two active layers adjacent to the anode 11 is greater than the melting point of another of the at least two active layers away from the anode 11.

A manufacturing process of the organic compound 13 including a hole transporting layer 131 and a organic luminescent layer 132 will be described below, as an example.

Figure 5:
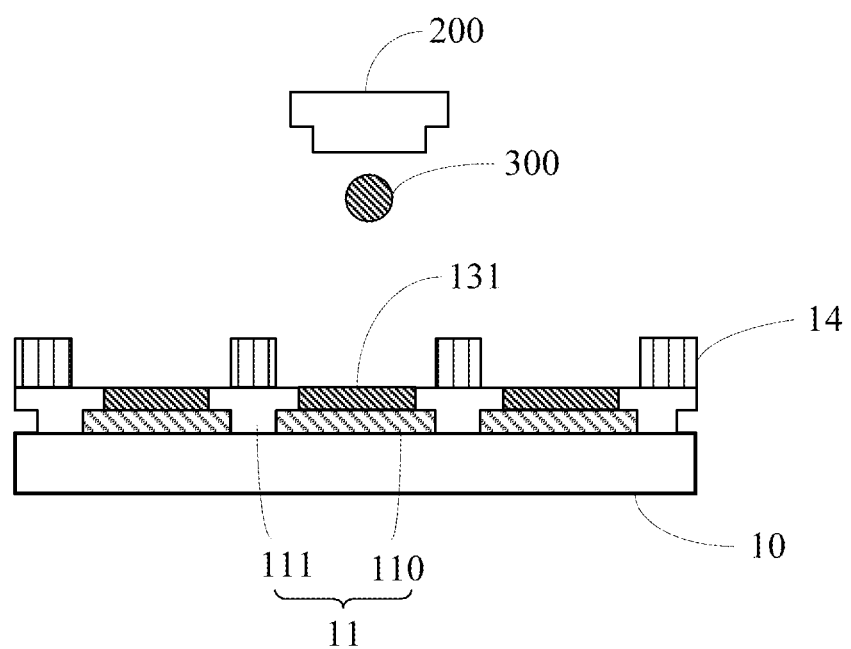
FIG. 5 shows a first material for forming a hole transporting layer is heated to a first temperature using a heating device in the manufacturing process of the organic light emitting device of FIG. 1.

First, as shown in FIG. 5, a first material 300 for forming the hole transporting layer 131 is heated to a first temperature using a heating device 200, to change the first material 300 from a solid state to a liquid state. And then the liquid first material 300 is coated on a surface of the anode 11. When the first material 300 is coated on the surface of the anode 11, the first material 300 is cooled and returns to solid state, to form the hole transporting layer 131. In this embodiment, the first temperature is greater than or equal to the melting point of the first material 300. The heating device can be an inkjet device.

Figure 6:
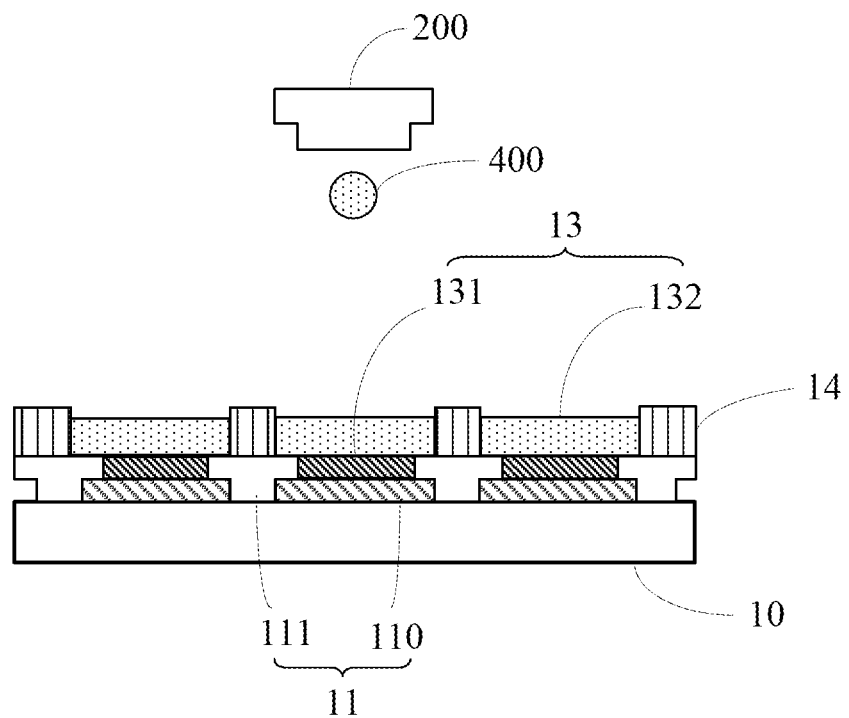
FIG. 6 shows a second material for forming an organic luminescent layer is heated to a second temperature using the heating device.

FIG. 6 illustrates a second material 400 for forming the organic luminescent layer 132 is heated to a second temperature using the heating device 200, to change the second material 400 from a solid state to a liquid state. And then the liquid second material 400 is coated on a surface of the hole transporting layer 131. When the liquid second material 400 is coated on the surface of the hole transporting layer 131, the liquid second material 400 is cooled and returns to the solid state, to form the organic luminescent layer 132. In this embodiment, the second temperature is greater than or equal to the melting point of the second material 400 but is less than the melting point of the first material 300. Thus, when the liquid second material 400 contacts the hole transporting layer 131, the hole transporting layer 131 is not hot melted because the temperature of the liquid second material 400 does not exceed the melting point of the hole transporting layer 131.

When the organic compound layer 13 includes other active layers, the other active layers can be made using the same method described above in relation to the hole injecting layer 131 and the organic luminescent layer 132.

Figure 7:
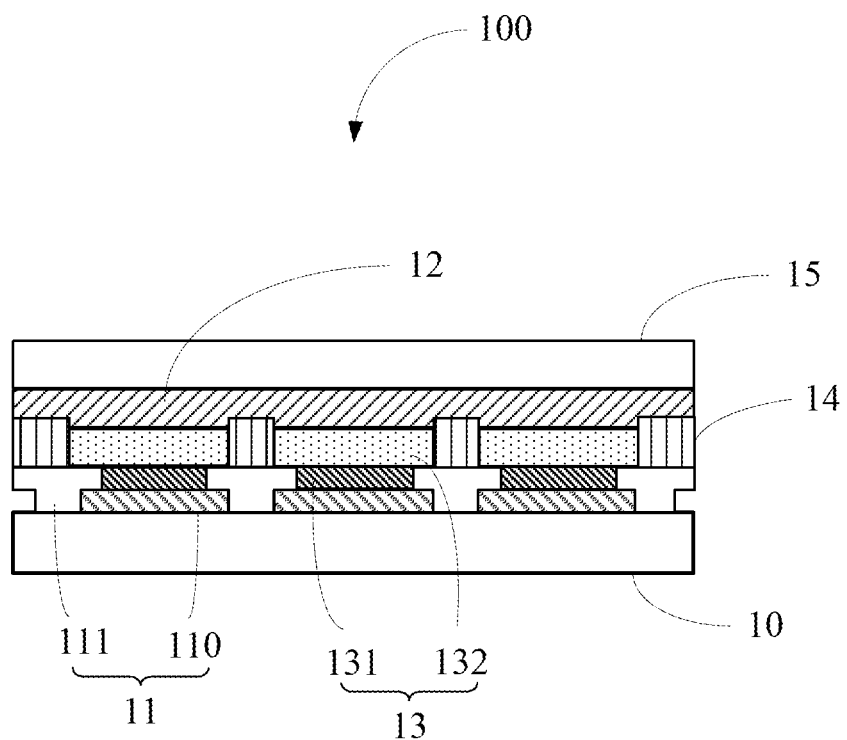
FIG. 7 shows a cathode is formed on a surface of the organic compound layer away from the anode and a protection layer is formed on a surface of the cathode away from the anode in the manufacturing process.

FIG. 7 illustrates after the organic compound layer 13 is formed on the anode 11, a cathode 12 is formed on a surface of the organic compound layer 13 away from the anode 11 and a protection layer 15 is formed on a surface of the cathode 12 away from the anode 11, to form the organic light emitting device 100.

Figure 8:
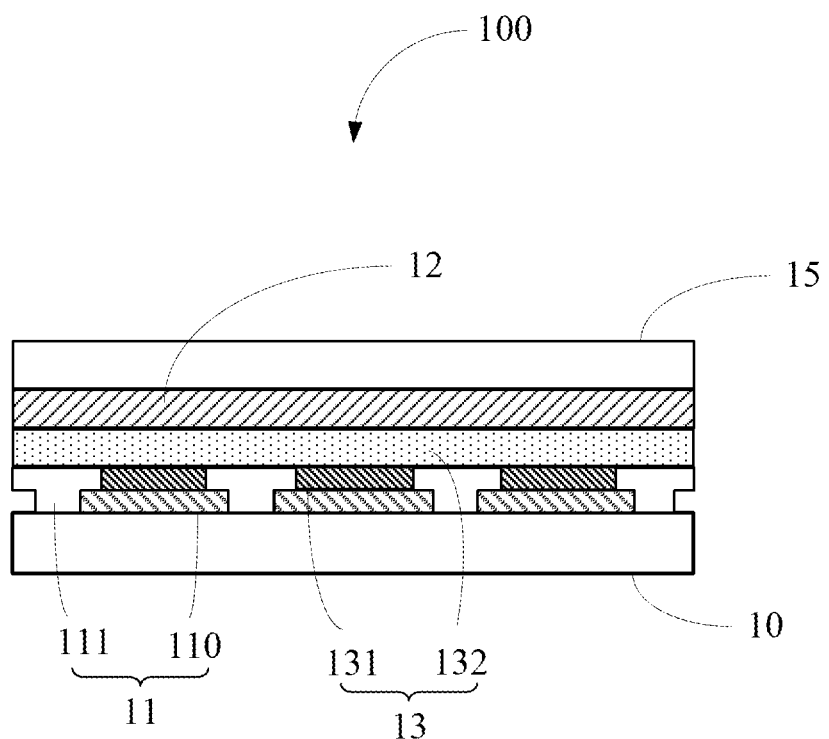
FIG. 8 shows a diagrammatic view of an organic light emitting device which does not include a spacer on an anode according to an exemplary embodiment.

In this embodiment, the organic compound layer 13 is formed in a space formed by the anode 11 and the spacers 14. However, since the organic compound layer 13 is made of solid organic material, the spacers 14 can be omitted in other embodiments. For example, referring to FIG. 8, the organic light emitting device 100 in which the spacers 14 are omitted is shown.

As described, since the organic compound layer 13 is made of solid organic materials by a hot melting method, the liquid materials for making the organic compound layer 13 can return to a solid state soon after being coated on the surface of the anode 11. Therefore, the film thickness mura of the organic compound layer 13 caused by surface tension of the liquid materials can be avoided.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. An organic light emitting device comprising:
   a substrate;
   a pair of electrode composed of an anode and a cathode formed on the substrate; and
   an organic compound layer sandwiched between the anode and the cathode, the organic compound layer comprising at least two active layers, wherein melting points of the at least two active layers gradually decreases along a direction from the anode to the cathode.

2. The organic light emitting device according to claim 1, wherein the organic compound layer comprises a hole transporting layer and an organic luminescent layer, the hole transporting layer is formed on a surface of the anode, and the organic luminescent layer is formed on a surface of the hole transporting layer; the hole transporting layer and the organic luminescent layer are respectively made of different organic materials having different melting points, a melting point of the hole transporting layer is greater than a melting point of the organic luminescent layer.

3. The organic light emitting device according to claim 1, wherein the organic compound layer comprises a hole injecting layer, a hole transporting layer, an organic luminescent layer, an electron injecting layer, and an electron transporting layer, which are respectively formed on a surface of the anode in sequence.

4. The organic light emitting device according to claim 1, wherein the at least two active layers of the organic compound layer are made of fatty acids compounds.

5. The organic light emitting device according to claim 4, wherein the fatty acids compounds are solid under a condition of room temperature.

6. The organic light emitting device according to claim 1, wherein the melting point of each of the at least two active layers is from 90 degrees to 130 degrees.

7. The organic light emitting device according to claim 1, further comprising a protection layer located on a surface of the cathode away from the anode, to protect or encapsulate the organic light emitting device.

8. The organic light emitting device according to claim 1, wherein the anode is a transparent electrode which is made of transparent conductive materials.

9. The organic light emitting device according to claim 8, wherein the anode is made of indium tin oxide (ITO), indium zinc oxide (IZO), aluminum zinc oxide (AZO), or transparent conductive film.

10. The organic light emitting device according to claim 1, wherein the anode comprises a plurality of electrode units and a plurality of insulators, each insulator is located between two adjacent electrode units to isolately separate the two adjacent electrode units.

11. The organic light emitting device according to claim 10, wherein the organic compound layer comprises a plurality of light emitting units 130, each light emitting unit is located on a surface of a corresponding electrode unit adjacent to the cathode; the organic light emitting device further comprises a plurality of spacers 14 respectively located on surfaces of the insulators; each spacer is located between two adjacent light emitting units to separate the two adjacent light emitting units.

12. An organic light emitting device comprising:
   a substrate;
   a pair of electrode composed of an anode and a cathode formed on the substrate; and
   an organic compound layer sandwiched between the anode and the cathode, the organic compound layer comprising at least two active layers, the anode being configured to inject electron holes into the organic compound layer, the cathode being configured to inject electrons into the organic compound layer, wherein melting points of each of the at least two active layers gradually decreases along a direction from the anode to the cathode.

* * * * *